US010580991B2

(12) United States Patent
Bao et al.

(10) Patent No.: US 10,580,991 B2
(45) Date of Patent: Mar. 3, 2020

(54) FLEXIBLE DISPLAY SCREEN, METHOD OF PRODUCING THE SAME, AND DISPLAY APPARATUS

(71) Applicants: BOE Technology Group Co., Ltd., Beijing (CN); BEIJING BOE DISPLAY TECHNOLOGY CO., LTD., Beijing (CN)

(72) Inventors: Huaxu Bao, Beijing (CN); Minghui Zhang, Beijing (CN); Xiaofeng Liu, Beijing (CN); Xiaojian Yang, Beijing (CN); Shumeng Sun, Beijing (CN); Inho Park, Beijing (CN); Weitao Chen, Beijing (CN)

(73) Assignees: BOE TECHNOLOGY GROUP CO., LTD., Beijing (CN); BEIJING BOE DISPLAY TECHNOLOGY CO., LTD., Beijing (CN)

( * ) Notice: Subject to any disclaimer, the term of this patent is extended or adjusted under 35 U.S.C. 154(b) by 0 days.

(21) Appl. No.: 15/772,626

(22) PCT Filed: Aug. 30, 2017

(86) PCT No.: PCT/CN2017/099673
§ 371 (c)(1),
(2) Date: May 1, 2018

(87) PCT Pub. No.: WO2018/153047
PCT Pub. Date: Aug. 30, 2018

(65) Prior Publication Data
US 2019/0123282 A1   Apr. 25, 2019

(30) Foreign Application Priority Data

Feb. 24, 2017   (CN) .......................... 2017 1 0104081

(51) Int. Cl.
*H01L 51/00*   (2006.01)
*H01L 51/56*   (2006.01)
(Continued)

(52) U.S. Cl.
CPC ...... *H01L 51/0043* (2013.01); *H01L 51/0097* (2013.01); *H01L 51/5012* (2013.01);
(Continued)

(58) Field of Classification Search
CPC combination set(s) only.
See application file for complete search history.

(56) References Cited

U.S. PATENT DOCUMENTS

2007/0190675 A1   8/2007   Yamazaki et al.
2016/0057835 A1*  2/2016   Wang ................... H05B 33/26
                                                          313/503

FOREIGN PATENT DOCUMENTS

CN   101017872 A   8/2007
CN   103094493 A   5/2013
(Continued)

OTHER PUBLICATIONS

First Office Action, including Search Report, for Chinese Patent Application No. 201710104081.3, dated Jul. 4, 2018, 17 pages.
(Continued)

*Primary Examiner* — Ratisha Mehta
(74) *Attorney, Agent, or Firm* — Westman, Champlin & Koehler, P.A.

(57) ABSTRACT

This application relates to a flexible display screen, comprising: a silicone substrate; a first electrode of polyacrylamide-lithium chloride hydrogel above the silicone substrate; a zinc sulfide-silicone light-emitting layer above the first electrode of polyacrylamide-lithium chloride hydrogel; and a second electrode of polyacrylamide-lithium chloride hydrogel above the zinc sulfide-silicone light-emitting layer.

20 Claims, 3 Drawing Sheets

(51) Int. Cl.
    *H01L 51/52* (2006.01)
    *H01L 51/50* (2006.01)
(52) U.S. Cl.
    CPC ...... *H01L 51/5206* (2013.01); *H01L 51/5234* (2013.01); *H01L 51/56* (2013.01); *H01L 51/0094* (2013.01)

(56) References Cited

FOREIGN PATENT DOCUMENTS

| | | |
|---|---|---|
| CN | 105702872 A | 6/2016 |
| CN | 105808005 A | 7/2016 |
| CN | 106784312 A | 5/2017 |

OTHER PUBLICATIONS

Li, Shuo et al., "A Stretchable Multicolor Display and Touch Interface Using Photopatterning and Tranfer Printing", Materials Views, www.MaterialsViews.com, Advanced Materials, www.advmat. de, wileyonlinelibrary.com, (c)WILEY-VCH Verlag GmbH & Co. KGaA, Weinheim, Adv. Mater. 2016, 28, 9770-9775, 6 pages.

Transmittal, International Search Report and Written Opinion for International Application No. PCT/CN2017/099673, dated Dec. 6, 2017, 11 pages.

King, Christopher N., "Electroluminescent displays", Planar Systems, Inc., Beaverton, OR, ©1996 American Vacuum Society, J. Vac. Sci. Technolo. A. 14(3), May/Jun. 1996, 0734-2101/96/14(3)/ 1729/7/$10.00, 7 pages.

Larson, C. et al., "Highly stretchable electroluminescent skin for optical signaling and tactile sensing", Flexible Electronics, Science, sciencemag.org, Mar. 4, 2016, vol. 351, Issue 6277, 5 pages.

Wood, Vanessa et al., "Inkjet-Printed Quantum Dot-Polymer Composites for Full-Color AC-Driven Displays", Advanced Materials, www.advmat.de, DOI: 10.1002/adma.200803256, Adv. Mater. 2009, 21, 2151-2155, ©2009 WILEY-VCH Verlag GmbH & Co. KGaA, Weinheim, 5 pages.

Xie, Bin et al., "Quantum Dots-Converted Light-Emitting Diodes Packaging for Lighting and Display: Status and Perspectives", Journal of Electronic Packaging, received Jan. 27, 2016, accepted manuscript posted Mar. 25, 2016, doi: 10.1115/1.4033143, ©2016 by ASME, 17 pages.

Second Office Action, including Search Report, for Chinese Patent Application No. 201710104081.3, dated Feb. 20, 2019, 21 pages.

* cited by examiner

FLEXIBLE DISPLAY SCREEN, METHOD OF PRODUCING THE SAME, AND DISPLAY APPARATUS

CROSS-REFERENCE TO RELATED APPLICATION

This application is a Section 371 National Stage Application of International Application No. PCT/CN2017/099673, filed Aug. 30, 2017, which is not yet published, and claims priority benefits from Chinese Application No. 201710104081.3 filed on Feb. 24, 2017, the entire contents of which are hereby incorporated by reference.

TECHNICAL FIELD

Embodiments of this disclosure relate to the technical field of display, and particularly to a flexible display screen and a method of producing the same, as well as a display apparatus comprising a flexible display screen.

BACKGROUND ART

With respect to the traditional TFT liquid crystal displays, it is difficult to implement bending and folding and flexible stretchable display screens cannot be produced, since the glass substrates, color filter (CF) substrates, TFT substrates, and the like to be used are all glass materials. Since the current flexible display screens often make use of the active-matrix display techniques based on OLEDs, the display screens have limited bendability and ductility, and may be maximally stretched to about 1.2 times the length of its own.

SUMMARY

According to an embodiment in one aspect of this application, there is provided a flexible display screen, comprising:
 a silicone substrate;
 a first electrode of polyacrylamide-lithium chloride hydrogel above the silicone substrate;
 a zinc sulfide-silicone light-emitting layer above the first electrode of polyacrylamide-lithium chloride hydrogel; and
 a second electrode of polyacrylamide-lithium chloride hydrogel above the zinc sulfide-silicone light-emitting layer.

According to an embodiment of this disclosure, the silicone substrate has a thickness approximately in a range of 0.5-1.5 mm.

According to an embodiment of this disclosure, first electrode of polyacrylamide-lithium chloride hydrogel has a thickness approximately in a range of 0.2-0.5 mm, and the second electrode of polyacrylamide-lithium chloride hydrogel has a thickness approximately in a range of 0.2-0.5 mm.

According to an embodiment of this disclosure, the zinc sulfide-silicone light-emitting layer has a thickness approximately in a range of 0.3-0.6 mm.

According to an embodiment of this disclosure, the flexible display screen further comprises a color filter layer above the second electrode of polyacrylamide-lithium chloride hydrogel.

According to an embodiment of this disclosure, the color filter layer has a thickness approximately in a range of 0.15-0.3 mm.

According to an embodiment of this disclosure, the color filter layer comprises a plurality of independent color filter units, and each of the color filter units comprises a red filter element, a green filter element, and a blue filter element.

According to an embodiment of this disclosure, the color filter layer further comprises a black matrix, and the color filter unit is located in an opening of the black matrix.

According to an embodiment of this disclosure, the color filter layer comprises a polyethylene terephthalate substrate.

According to an embodiment of this disclosure, the first electrode of polyacrylamide-lithium chloride hydrogel, the second electrode of polyacrylamide-lithium chloride hydrogel, and the zinc sulfide-silicone light-emitting layer all have integral plate-like structures.

According to an embodiment of this disclosure, the flexible display screen further comprises a transparent silicone protective layer above the color filter layer.

According to an embodiment of this disclosure, the transparent silicone protective layer has a thickness approximately in a range of 0.5-1.5 mm.

According to an embodiment of this disclosure, the zinc sulfide-silicone light-emitting layer comprises a plurality of independent light-emitting units, and each of the light-emitting units comprises a red light-emitting element, a green light-emitting element, and a blue light-emitting element.

According to an embodiment of this disclosure, the red light-emitting element is formed by doping a zinc sulfide-silicone light-emitting material with approximately 0.2% of manganese ions in terms of a molar concentration ratio.

According to an embodiment of this disclosure, the green light-emitting element is formed by doping a zinc sulfide-silicone light-emitting material with approximately 0.01% of copper ions in terms of a molar concentration ratio.

According to an embodiment of this disclosure, the blue light-emitting element is formed by doping a zinc sulfide-silicone light-emitting material with approximately 0.1% of copper ions in terms of a molar concentration ratio.

According to an embodiment of this disclosure, a layer where the light-emitting unit is located is provided with a rubber black matrix, and the light-emitting unit is located in an opening of the black matrix.

According to an embodiment of this disclosure, the first electrode of polyacrylamide-lithium chloride hydrogel is an anode of polyacrylamide-lithium chloride hydrogel, and the second electrode of polyacrylamide-lithium chloride hydrogel is a cathode of polyacrylamide-lithium chloride hydrogel.

According to an embodiment of this disclosure, wherein: the second electrode of polyacrylamide-lithium chloride hydrogel comprises a plurality of independent cathode units, and each of the cathode units covers a pixel unit; and the first electrode of polyacrylamide-lithium chloride hydrogel has an integral plate-like structure.

According to an embodiment of this disclosure, the flexible display screen further comprises a transparent silicone protective layer above the second electrode of polyacrylamide-lithium chloride hydrogel.

According to an embodiment in another aspect of this disclosure, there is provided a display apparatus, comprising a flexible display screen of the aforementioned embodiments.

According to an embodiment in another aspect of this disclosure, there is provided a method for producing a flexible display screen, comprising the steps of:
 providing a silicone substrate;
 forming a first electrode of polyacrylamide-lithium chloride hydrogel above the silicone substrate;

forming a zinc sulfide-silicone light-emitting layer above the first electrode of polyacrylamide-lithium chloride hydrogel; and forming a second electrode of polyacrylamide-lithium chloride hydrogel above the zinc sulfide-silicone light-emitting layer.

DETAILED DESCRIPTION

Figure 1:
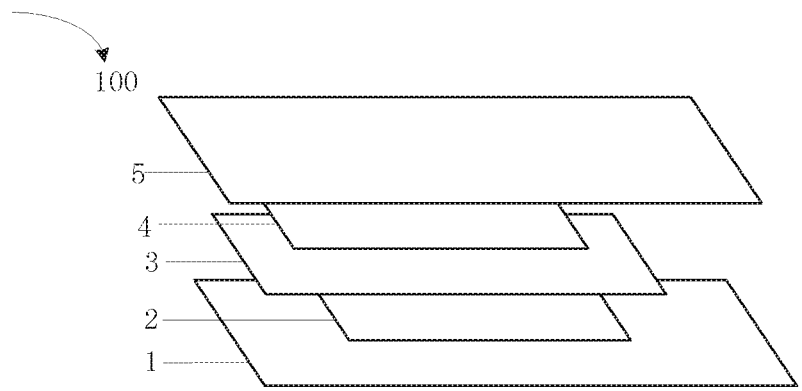
FIG. 1 is a disassembled structural diagram of a flexible display screen according to an embodiment of this application.

In order to elaborate the objects, technical solutions, and advantages of this disclosure more clearly, embodiments of this disclosure will be illustrated in detail below in conjunction with accompanying drawings. It should be understood that the description of embodiments below intended to explain and illustrate the general concept of this disclosure, and should not be construed as limiting this disclosure. In the specification, the same or similar reference numerals refer to the same or similar parts or members.

Positional terms used herein, such as "on", "under", "left", "right", "top", "bottom", or the like, refer to orientations exhibited in accompanying drawings. These positional terms are only for the purpose of facilitating description, and should not be construed as limiting this disclosure.

Since the current flexible display screens often make use of the active-matrix display techniques based on OLEDs, the display screens have limited bendability and ductility, and may be maximally stretched to about 1.2 times the length of its own. Therefore, with regard to the current flexible display screens, it is desirable to further improve the bendability and the ductility of display screens so as to better meet the requirements for the flexibility of flexible display screens by users.

FIG. 1 shows a disassembled structural diagram of a flexible display screen according to an exemplary embodiment of this disclosure. As shown in FIG. 1, the basic structure of the flexible display screen 100 comprises: a silicone substrate 1; a first electrode 2 of polyacrylamide-lithium chloride hydrogel above the silicone substrate 1; a zinc sulfide-silicone light-emitting layer 3 above the first electrode 2 of polyacrylamide-lithium chloride hydrogel; and a second electrode 4 of polyacrylamide-lithium chloride hydrogel above the zinc sulfide-silicone light-emitting layer 3.

According to technical solutions of this disclosure, the first electrode and the second electrode as described above may be an anode or a cathode, respectively.

Furthermore, as shown in FIG. 1, the flexible display screen 100 may further comprise a transparent silicone protective layer 5 above the second electrode 4 of polyacrylamide-lithium chloride hydrogel, so as to protect the anode, the cathode, and the light-emitting layer.

According to the embodiment as shown in FIG. 1, the silicone, which is the material of the substrate and the protective layer, is a transparent insulation material. The polyacrylamide-lithium chloride hydrogel, which is the material of the anode and the cathode, has conductivity and transparency. The zinc sulfide-silicone light-emitting layer may emit a white fluorescence under an alternating voltage, and will emit light of different colors when doped with metal ions of different contents and different types. For example, a red light may be emitted by doping the zinc sulfide-silicone light-emitting material with 0.2% of manganese ions, a green light may be emitted by doping the zinc sulfide-silicone with 0.01% of copper ions, a blue light may be emitted by doping the zinc sulfide-silicone with 0.1% of copper ions, and so on. The doping percentage described above refers to a molar concentration ratio. All of these materials described above have good elasticity and ductility, and may be maximally stretched to 4.8 times the original length thereof under the action of an external force. Display screens produced from these flexible materials have extremely good ductility and bendability, and it is possible to ensure that their light emitting properties are not or less affected at the time of bending or stretching. Additionally, since the zinc sulfide-silicone light-emitting layer may emit light spontaneously, a back light source is not needed and the display screen may be made relatively light and thin.

The constituent materials for forming respective specific layers of the flexible display screen according to this application are not particularly limited, and may be selected by those skilled in the art according to their conventional knowledge. Specifically, the commercially available products of the silicone for forming the silicone substrate include RSN-6018 produced by Dow Corning Corporation, US and KR-311 produced by Shin-Etsu Corporation, Japan. The commercially available products of the polyacrylamide-lithium chloride hydrogel as the materials of the anode and the cathode include the nonionic polyacrylamide hydrogel produced by Tianjin Hengyou Corporation (a component of lithium chloride may be added therein). Additionally, the commercially available products of the zinc sulfide-silicone for the light-emitting layer include RSN-6018 produced by Dow Corning Corporation, US and KR-311 produced by Shin-Etsu Corporation, Japan (a phosphorescent material of zinc sulfide may be added therein). All of the above materials have good elasticity and ductility.

Figure 2:
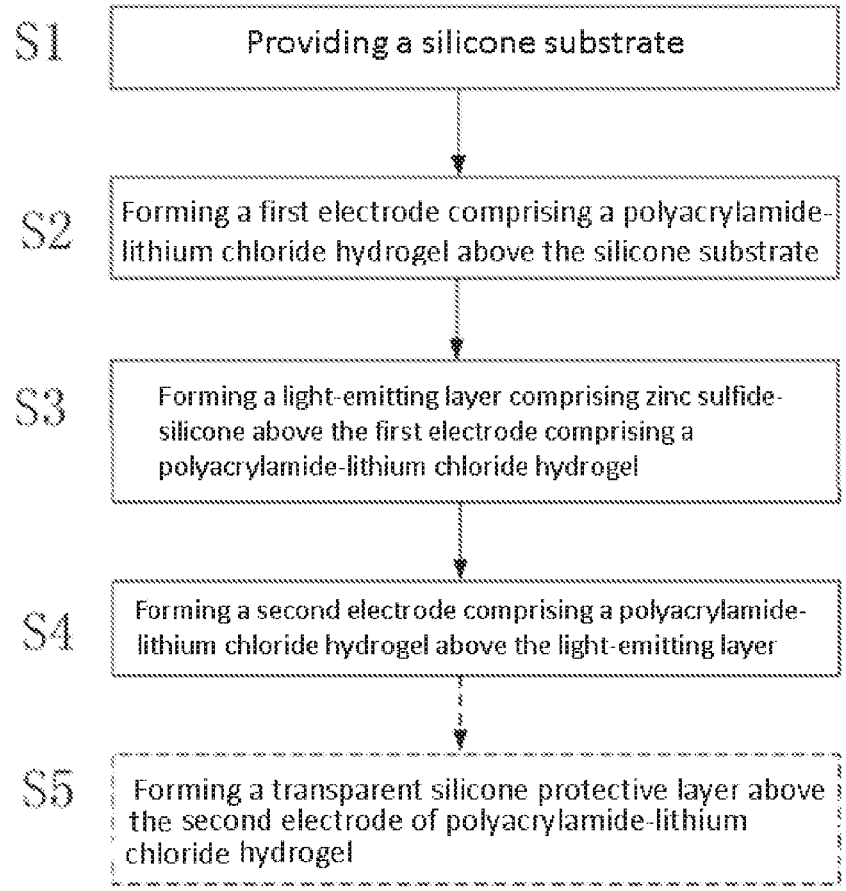
FIG. 2 is a flow chart of a method for producing the flexible display screen as shown in FIG. 1.

FIG. 2 is a flow chart of a method for producing the flexible display screen as shown in FIG. 1. As shown in FIG. 2, the production method of the flexible display screen in the embodiment described above comprises the following steps of:

S1: providing a silicone substrate;

S2: forming a first electrode comprising a polyacrylamide-lithium chloride hydrogel above the silicone substrate;

S3: forming a light-emitting layer comprising zinc sulfide-silicone above the first electrode comprising a polyacrylamide-lithium chloride hydrogel; and S4: forming a second electrode comprising a polyacrylamide-lithium chloride hydrogel above the light-emitting layer.

Optionally, the method may further comprise a step S5: forming a transparent silicone protective layer above the second electrode of polyacrylamide-lithium chloride hydrogel.

In the flexible display screen produced in the method described above, the thickness of the silicone substrate or the silicone protective layer may be approximately 0.5-1.5 mm, the thickness of the first electrode of polyacrylamide-lithium chloride hydrogel or the second electrode of polyacrylamide-lithium chloride hydrogel may be approximately 0.2-0.5 mm, and the thickness of the zinc sulfide-silicone light-emitting layer may be approximately 0.3-0.6 mm.

According to technical solutions of this disclosure, the first electrode and the second electrode as described above may be an anode or a cathode, respectively.

Figure 3:
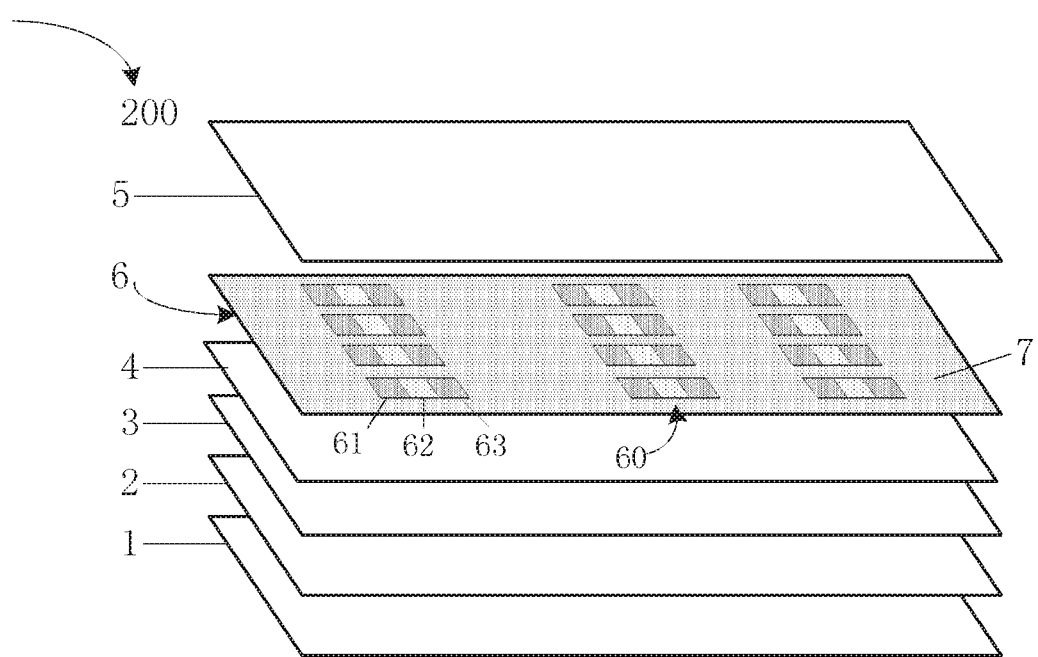
FIG. 3 is a disassembled structural diagram of a flexible display screen according to another embodiment of this application.

According to other embodiments, in order to achieve full-color display, the flexible display screen as shown in FIG. 1 may comprise a color filter layer. FIG. 3 shows a disassembled structural diagram of a flexible display screen of an embodiment as a means of achieving full-color display. As shown in FIG. 3, the flexible display screen 200 comprises: a silicone substrate 1; a first electrode 2 of polyacrylamide-lithium chloride hydrogel above the silicone substrate 1; a zinc sulfide-silicone light-emitting layer 3 above the first electrode 2 of polyacrylamide-lithium chloride hydrogel; a second electrode 4 of polyacrylamide-lithium chloride hydrogel above the zinc sulfide-silicone light-emitting layer 3; a color filter layer 6 above the second electrode 4 of polyacrylamide-lithium chloride hydrogel; and a transparent silicone protective layer 5 above the color filter layer 6.

As can be seen, compared to the flexible display screen 100 of FIG. 1, a color filter layer 6 is added between the second electrode 4 of polyacrylamide-lithium chloride hydrogel and the transparent silicone protective layer 5 in the flexible display screen 200 of FIG. 3.

Specifically, the color filter layer 6 comprises a plurality of independent color filter units 60 arranged in an array, and each of the color filter unit 60 corresponds to one pixel unit and comprises a red filter element 61, a green filter element 62, and a blue filter element 63, which correspond to R, G, and B sub-pixels respectively. When a voltage is applied between the first electrode 2 of polyacrylamide-lithium chloride hydrogel and the second electrode 4 of polyacrylamide-lithium chloride hydrogel, the zinc sulfide-silicone light-emitting layer 3 emits white light, which is filtered through the red filter element 61, the green filter element 62, and the blue filter element 63 of the color filter unit 60 to emit red light, green light, and blue light respectively. The three colors are combined to achieve full-color display.

As shown in FIG. 3, in order to prevent interference of light emission between pixel units, the color filter layer 6 further comprises black matrices 7 provided around respective color filter units 60 to play a role of separation between pixel units.

Figure 3A:
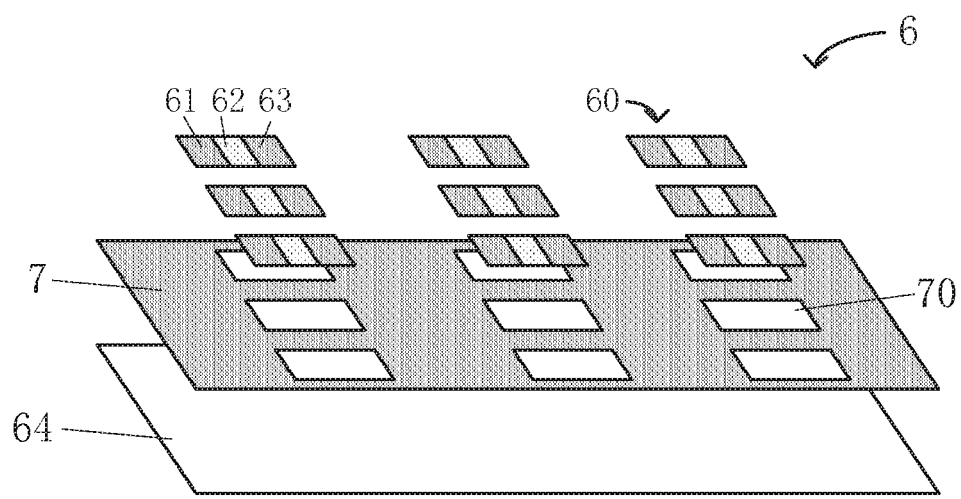
FIG. 3a is a disassembled structural diagram illustrating an example structure of a color filter layer in FIG. 3.

FIG. 3a shows a disassembled structure of an example of a color filter layer 6. This color filter layer 6 comprises a flexible substrate 64, and color filter units 60 formed above the flexible substrate 64. Each of the color filter units 60 comprises a red filter element 61, a green filter element 62, and a blue filter element 63, and black matrices 7 are formed between respective color filter units 60.

According to one embodiment, the color filter layer 6 as shown in FIG. 3a may be produced by a conventional photolithographic process. Specifically, first, a flexible substrate 64 having better elasticity and ductility, for example a PET (polyethylene terephthalate) substrate, is provided; then, a black photoresist is applied to the PET substrate 64 and a pattern of a black matrix 7 is formed by exposure and development, wherein an opening 70 for containing a color filter unit 60 is formed in the pattern of the black matrix 7; and next, red, green, and blue photoresists are applied, in this order, above the black matrix 7, and patterns of a red filter element 61, a green filter element 62, and a blue filter element 63 are respectively formed by exposure and development. Each set of a red filter element 61, a green filter element 62, and a blue filter element 63 constitutes one color filter unit 60.

In the flexible display screen 200 of the embodiment described above, the thickness of the silicone substrate 1 or the silicone protective layer 5 is approximately 0.5-1.5 mm, the thickness of the first electrode 2 of polyacrylamide-lithium chloride hydrogel or the second electrode 4 of polyacrylamide-lithium chloride hydrogel is approximately 0.2-0.5 mm, the thickness of the zinc sulfide-silicone light-emitting layer 3 is approximately 0.3-0.6 mm, the thickness of the color filter layer 6 may be approximately 0.15-0.3 mm, and the thickness of the black matrix 7 may be approximately 0.1-0.2 mm.

Furthermore, as shown in FIG. 3, the first electrode 2 of polyacrylamide-lithium chloride hydrogel, the second electrode 4 of polyacrylamide-lithium chloride hydrogel, and the zinc sulfide-silicone light-emitting layer 3 all have integral plate-like structures. Therefore, it is easy to integrally produce the first electrode 2 of polyacrylamide-lithium chloride hydrogel, the second electrode 4 of polyacrylamide-lithium chloride hydrogel, and the zinc sulfide-silicone light-emitting layer 3.

The display screen of FIG. 3 may further comprise other additional structures, control circuits, and the like known to the person skilled in the art, and verbose words are omitted herein.

With respect to the flexible display screen 200 in the embodiment as shown in FIG. 3, each layer of the display screen is produced from a material having better elasticity and ductility, and for example, may be maximally stretched to 4.8 times the original length under the action of an external force. The whole flexible display screen exhibits good bendability and ductility so as to be capable of meeting relatively high requirements for the flexibility of flexible display screens by users. Additionally, by achieving full-color display using a relatively mature color filter (CF) process, the process is relatively simple, the cost is low, and it is suitable for producing large-size display screens.

Figure 4:
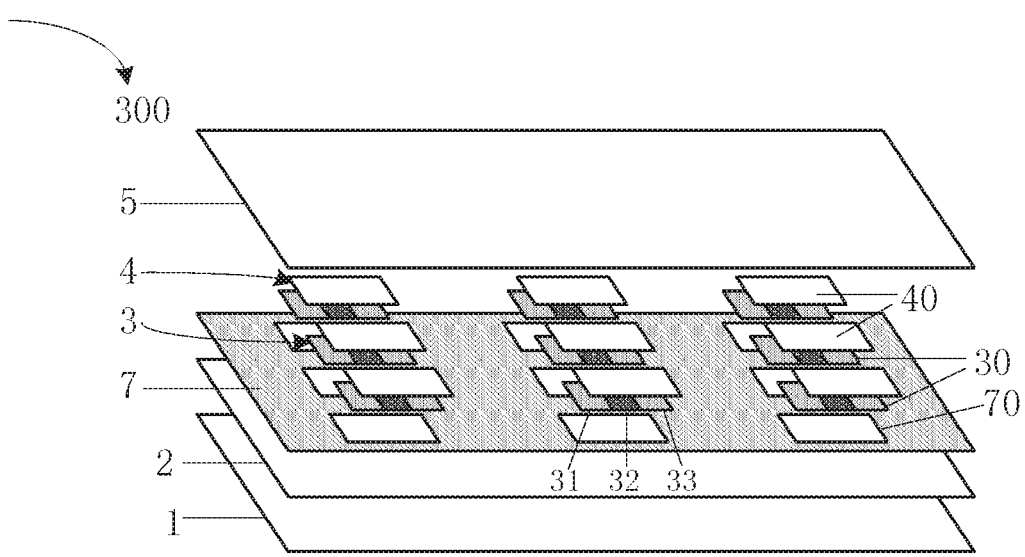
FIG. 4 is a disassembled structural diagram of a flexible display screen according to another embodiment of this application.

FIG. 4 shows a disassembled structural diagram of a flexible display screen 300 of an embodiment as another means of achieving full-color display. As shown in FIG. 4, the flexible display screen 300 comprises: a silicone substrate 1; a first electrode 2 of polyacrylamide-lithium chloride hydrogel above the silicone substrate 1; a zinc sulfide-silicone light-emitting layer 3 above the first electrode 2 of polyacrylamide-lithium chloride hydrogel; a second electrode 4 of polyacrylamide-lithium chloride hydrogel above the zinc sulfide-silicone light-emitting layer 3; and a transparent silicone protective layer 5 above the second electrode 4 of polyacrylamide-lithium chloride hydrogel.

As can be seen, compared to the flexible display screen 100 of FIG. 1, the zinc sulfide-silicone light-emitting layer 3 in the flexible display screen 300 as shown in FIG. 4 has a different configuration. Specifically, as shown in FIG. 4, the zinc sulfide-silicone light-emitting layer 3 comprises a plurality of independent light-emitting units 30 arranged in an array, and each of the light-emitting units 30 corresponds to one pixel unit and comprises a red light-emitting element 31, a green light-emitting element 32, and a blue light-emitting element 33, which correspond to R, G, and B sub-pixels respectively. In this embodiment, a means of independent pixel light emission is used to achieve full-color display and the color filter layer may be omitted, and it is suitable for producing high-resolution display products.

According to the embodiment as shown in FIG. 4, by doping the zinc sulfide-silicone light-emitting material with metal ions of different types and different contents, lights of different colors may be emitted. According to an example, the red light-emitting element 31 is formed by doping a zinc sulfide-silicone light-emitting material with 0.2% of manganese ions, the green light-emitting element 32 is formed by doping a zinc sulfide-silicone light-emitting material with 0.01% of copper ions, and the blue light-emitting element 33 is formed by doping a zinc sulfide-silicone light-emitting material with 0.1% of copper ions. The doping percentage described above refers to a molar concentration ratio. When a voltage is applied between the first electrode 2 of polyacrylamide-lithium chloride hydrogel and the second electrode 4 of polyacrylamide-lithium chloride hydrogel, the red light-emitting element 31, the green light-emitting element 32, and the blue light-emitting element 33 emit red light, green light, and blue light respectively. The three colors are combined to achieve full-color display.

As shown in FIG. 4, in order to prevent interference of light emission between pixel units, a layer where the light-emitting unit 30 is located is provided with a black matrix 7 to play a role of separation between pixel units. The black matrix 7 may be produced from a rubber material having better elasticity and ductility. The light-emitting unit 30 is located in the opening 70 of the black matrix 7.

In the flexible display screen 300 of the embodiment described above, the thickness of the silicone substrate 1 or the silicone protective layer 5 is approximately 0.5-1.5 mm, the thickness of the first electrode 2 of polyacrylamide-lithium chloride hydrogel or the second electrode 4 of polyacrylamide-lithium chloride hydrogel is approximately 0.2-0.5 mm, the thickness of the zinc sulfide-silicone light-emitting layer 3 is approximately 0.3-0.6 mm, and the thickness of the black matrix 7 is approximately 0.3-0.6 mm.

Furthermore, in the embodiment as shown in FIG. 4, the first electrode 2 of polyacrylamide-lithium chloride hydrogel has an integral plate-like structure, and the second electrode 4 of polyacrylamide-lithium chloride hydrogel comprises a plurality of independent cathode units 40, and each of the cathode units 40 covers a pixel unit 30. The use of this cathode structure facilitates the control of independent light emission of respective pixel units so as to improve the resolution of display images.

The display screen of FIG. 4 may further comprise other additional structures or control circuits known to the person skilled in the art, and verbose words are omitted herein.

With respect to the flexible display screen 300 in the embodiment as shown in FIG. 4, each layer of the display screen is produced from a material having better elasticity and ductility. The whole flexible display screen exhibits good bendability and ductility so as to be capable of meeting relatively high requirements for the flexibility of flexible display screens by users. Furthermore, by using a means of independent pixel light emission to achieve full-color display and the color filter layer may be omitted, and it is suitable for producing high-resolution display products.

For example, the flexible display screen of this disclosure may be used for display screens of electronic products such as smart watches, smart wristbands, and the like, and other products which need dynamic and flexible display, so as to meet the usage requirements by users.

An embodiment of this disclosure further provides a display apparatus, comprising a flexible display screen of the aforementioned embodiments. Therefore, this display apparatus may meet relatively high requirements for the flexibility of flexible display screens by users.

With respect to the display screen, the display apparatus, and the display method in various embodiments of this application, since the flexible materials such as silicone, hydrogel, and the like are used, the display screen may endure a relatively large degree of bending and stretching and thus maintain light emitting properties so as to meet the relatively high requirements for the flexibility of flexible display screens by users.

Although some specific embodiments of this disclosure have been described above with reference to accompanying drawings, it should be understood by the person skilled in the art that the constituents of respective embodiments may be combined or replaced with each other without being conflicted. For example, the anode and the cathode of the display screen 200 in FIG. 2 may also employ a structure form of a plurality of independent units corresponding color filter units, and the cathode of the display screen 300 in FIG. 3 may also have an integral plate-like form.

Several embodiments of this disclosure have been described by way of example. However, it will be recognized by the person skilled in the art that various modifications and variations may be made to the embodiments of this disclosure without departing from the concept of this disclosure. All of these modifications and variations should fall in the scope protected by this disclosure. Therefore, the protection scope protected by this disclosure is determined by the protection scope defined by the claims.

What is claimed is:

1. A flexible display screen, comprising:
   a silicone substrate;
   a first electrode of polyacrylamide-lithium chloride hydrogel above the silicone substrate;
   a zinc sulfide-silicone light-emitting layer above the first electrode of polyacrylamide-lithium chloride hydrogel; and
   a second electrode of polyacrylamide-lithium chloride hydrogel above the zinc sulfide-silicone light-emitting layer.

2. The flexible display screen according to claim 1, wherein the silicone substrate has a thickness approximately in a range of 0.5-1.5 mm.

3. The flexible display screen according to claim 1, wherein the first electrode of polyacrylamide-lithium chloride hydrogel has a thickness approximately in a range of 0.2-0.5 mm, and the second electrode of polyacrylamide-lithium chloride hydrogel has a thickness approximately in a range of 0.2-0.5 mm.

4. The flexible display screen according to claim 1, wherein the zinc sulfide-silicone light-emitting layer has a thickness approximately in a range of 0.3-0.6 mm.

5. The flexible display screen according to claim 1, further comprising a color filter layer above the second electrode of polyacrylamide-lithium chloride hydrogel.

6. The flexible display screen according to claim 5, wherein the color filter layer has a thickness approximately in a range of 0.15-0.3 mm.

7. The flexible display screen according to claim 5, wherein the color filter layer comprises a polyethylene terephthalate substrate.

8. The flexible display screen according to claim 1, wherein the first electrode of polyacrylamide-lithium chloride hydrogel, the second electrode of polyacrylamide-lithium chloride hydrogel, and the zinc sulfide-silicone light-emitting layer all have integral plate-like structures.

9. The flexible display screen according to claim 5, further comprising a transparent silicone protective layer above the color filter layer.

10. The flexible display screen according to claim 9, wherein the transparent silicone protective layer has a thickness approximately in a range of 0.5-1.5 mm.

11. The flexible display screen according to claim 1, wherein the zinc sulfide-silicone light-emitting layer comprises a plurality of independent light-emitting units, and each of the light-emitting units comprises a red light-emitting element, a green light-emitting element, and a blue light-emitting element.

12. The flexible display screen according to claim 11, wherein the red light-emitting element is formed by doping a zinc sulfide-silicone light-emitting material with approximately 0.2% of manganese ions in terms of a molar concentration ratio.

13. The flexible display screen according to claim 11, wherein the green light-emitting element is formed by doping a zinc sulfide-silicone light-emitting material with approximately 0.01% of copper ions in terms of a molar concentration ratio.

14. The flexible display screen according to claim 11, wherein the blue light-emitting element is formed by doping a zinc sulfide-silicone light-emitting material with approximately 0.1% of copper ions in terms of a molar concentration ratio.

15. The flexible display screen according to claim 11, wherein a layer where the light-emitting unit is located is provided with a rubber black matrix, and the light-emitting unit is located in an opening of the black matrix.

16. The flexible display screen according to claim 14, wherein the first electrode of polyacrylamide-lithium chloride hydrogel is an anode of polyacrylamide-lithium chloride hydrogel, and the second electrode of polyacrylamide-lithium chloride hydrogel is a cathode of polyacrylamide-lithium chloride hydrogel.

17. The flexible display screen according to claim 16, wherein:
the second electrode of polyacrylamide-lithium chloride hydrogel comprises a plurality of independent cathode units, and each of the cathode units covers a pixel unit; and
the first electrode of polyacrylamide-lithium chloride hydrogel has an integral plate-like structure.

18. The flexible display screen according to claim 1, further comprising a transparent silicone protective layer above the second electrode of polyacrylamide-lithium chloride hydrogel.

19. A display apparatus, comprising a flexible display screen as claimed in claim 1.

20. A method for producing a flexible display screen, comprising the steps of:
providing a silicone substrate;
forming a first electrode of polyacrylamide-lithium chloride hydrogel above the silicone substrate;
forming a zinc sulfide-silicone light-emitting layer above the first electrode of polyacrylamide-lithium chloride hydrogel; and
forming a second electrode of polyacrylamide-lithium chloride hydrogel above the zinc sulfide-silicone light-emitting layer.

* * * * *